INVENTOR
Peter G. Bartlett

BY Hall, Pollock & Vande Sande
ATTORNEY

United States Patent

[11] 3,613,029

[72] Inventor Peter G. Bartlett
Davenport, Iowa
[21] Appl. No. 44,261
[22] Filed June 8, 1970
[45] Patented Oct. 12, 1971
[73] Assignee Struthers-Dunn, Inc.
Pitman, N.J.

[54] CRYSTAL-CONTROLLED CROSS-COUPLED NAND GATE SQUARE-WAVE GENERATOR
7 Claims, 2 Drawing Figs.

[52] U.S. Cl. .......... 331/113 R, 307/215, 307/292, 331/108 D, 331/116 R, 331/159
[51] Int. Cl. .......... H03b 5/36, H03k 3/282
[50] Field of Search .......... 331/113 R, 116 R, 144, 159, 108 D, 107 R; 307/215, 291, 292

[56] References Cited
UNITED STATES PATENTS
3,517,326 6/1970 Roesch .......... 307/215 X
OTHER REFERENCES
Nadler, " DTL astable mulivibrator is fast and reliable," Electronic Design, Vol. 13, June 21, 1969, pp. 83,84. (331-108D).

*Primary Examiner*—Roy Lake
*Assistant Examiner*—Siegfried H. Grimm
*Attorneys*—William D. Hall, Elliott I. Pollock, Fred C. Philpitt, George Vande Sande, Charles F. Steininger and Robert R. Priddy

ABSTRACT: An integrated-circuit, crystal-controlled square wave pulse generator employing a pair of cross-coupled NAND gates. The output of one NAND gate is coupled to the other through a piezoelectric crystal, and the output of said other NAND gate is coupled to the input of said one NAND gate through a capacitor. Inverse feedback is provided for each NAND gate to maintain its operation in a linear portion of its operation.

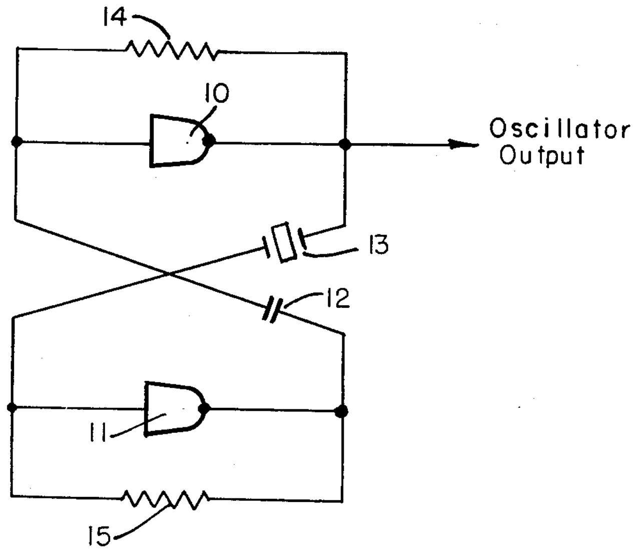

CRYSTAL-CONTROLLED CROSS-COUPLED NAND GATE SQUARE-WAVE GENERATOR

BACKGROUND OF THE INVENTION

Electronic circuitry frequently requires the inclusion of a square-wave pulse generator. Such a pulse generator may be used as the basis for the generation of various types of gating signals, trigger pulses, etc. It is of course known in the art to provide such oscillators in the form of crystal-controlled oscillators having a precisely predetermined frequency of operation. Heretofore, such oscillators have been formed of discrete components which, although providing proper operation, have the disadvantage of being more costly than integrated circuits because of the greater cost of the components entering into such an oscillator and also because of the rather considerable labor time in assembling such components into an operative oscillator. For this reason, it has long been considered desirable to provide a square-wave oscillator with accurately controlled frequency using, instead of discrete components, an integrated circuit. This design goal has been difficult of accomplishment, however, because of the inherent characteristic of integrated circuits to comprise inherently saturating devices, i.e., devices which are stable in either of two extreme states, generally either fully cut off or fully conductive, neither condition being suitable for operation as an oscillator. Now, however, with the present invention, it becomes possible to provide a crystal-controlled, square-wave pulse generator of integrated circuit design which overcomes all of the heretofore known disadvantages of such a circuit.

SUMMARY OF THE INVENTION

The crystal-controlled square-wave pulse generator of the present invention comprises a pair of cross-coupled NAND gates, with the cross-coupling connection between the output of one gate and the input of the other including a series-connected piezoelectric crystal whose resonance frequency is substantially that of the frequency of the desired square-wave frequency. The cross-coupling between the other pair of gates is preferably one which includes a capacitor.

When a pair of NAND gates is cross-coupled by impedance elements which block direct current, and no further direct current coupling is provided to the gate input, then the gate input may be considered as "floating". Where NAND logic circuitry is employed, the presence of the floating inputs for the two gates causes each gate output to go to zero saturation; consequently, it is impossible for the inputs of the gates to alternate repetitively between opposite polarities as is required in order for the cross-coupled NAND gates to reverse their conditions alternately and provide the required oscillator operation.

I have found, however, that the foregoing problem can be solved by providing a negative feedback from the output of each NAND gate to its input. The amount of feedback is chosen to provide for operation of each NAND gate out of its saturation region but still to provide a gain for the gate which is greater than one. When this is done, the NAND gate operates in its generally linear operating region.

The foregoing problem is particularly critical when the transistors used in the respective NAND gates are of a high noise immunity type having, for example, a threshold operating level of approximately 6 volts. It will be appreciated by one skilled in the art that such noise immunity may be provided by including a zener diode in the input to the base circuit of the transistor included in the NAND gate.

Therefore, the present invention involves the use of two cross-coupled NAND gates, with the respective cross-coupling circuits including appropriate impedance elements which are direct current blocking, and with each gate having a feedback loop from its output to its input.

BRIEF DESCRIPTION OF THE DRAWINGS

In describing the invention, reference will be made to the accompanying drawings in which.

DETAILED DESCRIPTION OF THE PREFERRED EMBODIMENT

Figure 1:
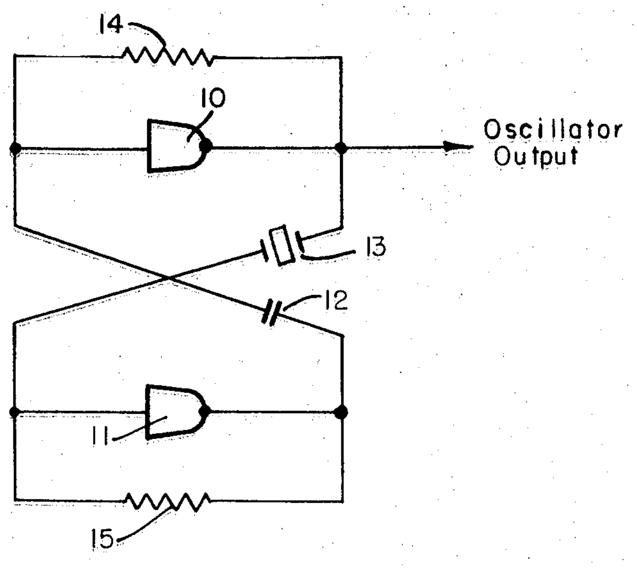
FIG. 1 is a schematic representation of the oscillator of the present invention.

FIG. 1 diagrammatically illustrates the oscillator of the present invention. The oscillator comprises two cross-coupled NAND gates 10 and 11. The input of NAND gate 10 is coupled to the output of NAND gate 11 through a capacitor 12. Similarly, the output of gate 10 is connected to the input of gate 11 through a piezoelectric crystal 13. The output of the oscillator may be obtained from either NAND gate 10 or NAND gate 11, and since the two NAND gates are always in the opposite state when the oscillator is operating, it will be apparent that the outputs of the two NAND gates are identical except that they are of opposite polarity. FIG. 1 further illustrates that each NAND gate has its output coupled to its own input through a feedback resistor which, in the case of gate 10 is designated as resistor 14, and in the case of gate 11 is designated as resistor 15.

As is known in the art, the output of a NAND gate is positive except when all of its inputs are concurrently supplied with a positive voltage of at least a predetermined minimum amplitude, in which event the output of the gate goes to zero. In the configuration of FIG. 1, each gate is shown as having only one input, and accordingly, when such input is present in the form of a positive signal voltage, then the output of the NAND gate is at zero voltage, whereas, when the single input is absent or below the predetermined minimum amplitude, the output voltage of the gate goes positive.

It is also well known in the art that when two NAND gates are directly cross coupled, i.e., with a direct connection between the output of each gate and the input of the associated gate, the two gates will then rapidly alternate their conductive states so that the circuit will then operate in much the same manner as a free-running multivibrator. When the cross coupling comprises a crystal and a capacitor, as shown in FIG. 1, the circuit will operate in much the same manner as do the directly cross-coupled NAND gates, but will operate at the resonance frequency of crystal. At frequencies other than resonance, the cross coupling through the circuit path including the crystal presents a substantial impedance, but at the resonance frequency of the crystal the cross coupling through the crystal is at a very low or near zero impedance. Also, the capacitor 12 is selected in value so that, at the resonance frequency of the crystal, it too presents a negligible amount of impedance in the cross coupling between the output of gate 11 and the input of gate 10.

It has nevertheless been found that a pair of cross-coupled NAND gates with the cross-coupling circuits comprising a piezoelectric crystal and a capacitor as shown in FIG. 1 so that the gate inputs are "floating" will not operate properly as a square-wave pulse generator. The reason for this is that the actual circuitry of each NAND gate is so arranged that it operates at full saturation. Thus, in the case of sink logic circuitry, a floating input, i.e., an input which is not DC coupled to ground, will saturate by having its output go to zero. In the case of NOR logic circuitry, on the other hand, a floating input will cause the output to go to the level of the supply voltage. More particularly, referring to FIG. 2, the NAND gate comprising transistor TR1 will, under conditions where its input terminals 16 and 17 are floating, go to zero voltage of the (+) supply. When two such NAND gates are cross coupled in the manner shown in FIG. 1, both outputs will then go to zero, and it is then not possible to provide the alternation in the outputs of the two NAND gates and thus also the required alternation of their inputs in order to obtain oscillatory action.

The foregoing problem can be overcome, however, by providing a feedback resistor between the input and output of each NAND gate. Thus, in FIG. 2, the collector of transistor TR1 is connected through resistor 19 to the so-called "expander" input at terminal 18. The feedback resistor in the feedback circuit is designated in FIG. 2 by the resistor 19. The magnitude of the feedback resistor is chosen so as to keep transistor TR1 out of saturation but still to permit it to have a gain greater than one so as to sustain oscillations. With this amount of feedback, operation will occur over the generally linear portion of the transistor operating characteristic.

Figure 2:
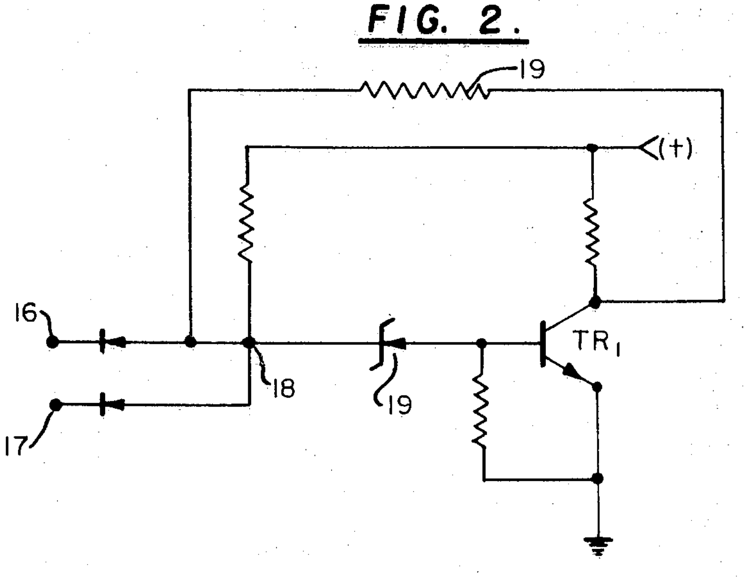
FIG. 2 is a circuit diagram of a single one of the NAND gates of FIG. 1 and particularly illustrating the feedback connection between the output and the input of such NAND gate transistor.

The feedback circuit of FIG. 2 is shown as providing feedback from the collector of transistor TR1 to the expander input terminal at 18. If desired, the feedback can instead be provided to one of the input terminals such as the terminal 16 or 17. This may be necessary where the integrated circuit is of the type which does not have available an expander input terminal to which connection may be made. However, in the event that connection is made by the feedback resistor 19 to an input terminal 16 or 17, it is then necessary that the potential at the collector of transistor TR1 go below the threshold bias provided by the zener diode 19 in order that the feedback will have the desired effect.

The oscillator of this invention is shown as being crystal controlled, but it will be understood that the crystal 13 can, if desired, be replaced by a second coupling capacitor, In that event, however, the oscillator will not necessarily operate at a precisely predetermined frequency as it will when the crystal is employed. However, for effective operation of the oscillator, when each cross-coupling path uses a capacitor, it is still desirable to employ the feedback network for each of the NAND gates as shown in FIG. 1.

The crystal-controlled, integrated-circuit oscillator of the present invention may be constructed at very low cost because of its use of integrated circuit components. An additional advantage, however, is that the crystal-controlled oscillator makes possible a low impedance connection to both terminals of the crystal. This is because the negative feedback inherently provides a low impedance output of the gate 10 to which it is coupled and, with the arrangement of FIG. 1, the crystal 13 is also coupled to the low impedance input of gate 11. This means that there is, in effect, only a very low impedance in series with the crystal, and this characteristic is desirable in order to provide accurate frequency control. Thus, the presence of a low impedance in series with the crystal means that, at resonance, the overall impedance in the circuit is extremely low so that there is a significant change in impedance between resonance and nonresonance conditions. In contrast to this, when there is a significant impedance in series with the crystal, then, under resonance conditions, the circuit still includes the series impedance with the result that there is then a smaller change in impedance between resonance and nonresonance conditions with the result that frequency control cannot be as precisely maintained.

What I claim is:

1. An integrated-circuit square-wave oscillator comprising in combination, a pair of NAND gates, first coupling means connected between the output of a first of said gates and the input of the other said gate, second coupling means connected between the output of said other gate and the input of said first gate, and a negative feedback circuit coupled between the output and input of each said gate.

2. The oscillator of claim 1 wherein said first coupling means comprises a capacitor.

3. The oscillator of claim 2 wherein said second coupling means comprises a piezoelectric crystal.

4. The oscillator of claim 1 wherein said negative feedback circuit comprises a resistive coupling between the input and output of each said gate.

5. The oscillator of claim 1 wherein each said gate includes an expander input and said feedback circuit couples the output of each gate to its said expander input.

6. The oscillator of claim 1 wherein at least one of said first and second coupling means comprises a capacitor.

7. The oscillator of claim 1 wherein both said first and second coupling means comprise a capacitor.